United States Patent
Wang et al.

(10) Patent No.: US 8,587,279 B2
(45) Date of Patent: Nov. 19, 2013

(54) POWER CONVERSION APPARATUS

(75) Inventors: Fan Wang, Nagoya (JP); Tomonori Kimura, Obu (JP); Atsushi Kobayashi, Kariya (JP); Hideaki Ishihara, Okazaki (JP); Masakiyo Horie, Gamagori (JP)

(73) Assignee: DENSO CORPORATION, Kariya (JP)

( * ) Notice: Subject to any disclaimer, the term of this patent is extended or adjusted under 35 U.S.C. 154(b) by 93 days.

(21) Appl. No.: 13/409,269

(22) Filed: Mar. 1, 2012

(65) Prior Publication Data
US 2012/0223667 A1  Sep. 6, 2012

(30) Foreign Application Priority Data
Mar. 4, 2011 (JP) ................................. 2011-048073

(51) Int. Cl.
*G05F 1/00* (2006.01)

(52) U.S. Cl.
USPC ........ 323/282; 323/271; 323/283; 363/21.06; 363/21.14; 318/800

(58) Field of Classification Search
USPC .......... 318/800, 801, 798; 323/222, 231, 271, 323/272, 282, 283, 284; 363/21.06, 21.14
See application file for complete search history.

(56) References Cited

U.S. PATENT DOCUMENTS

| | | | | |
|---|---|---|---|---|
| 5,313,382 A * | 5/1994 | Farrington | ....................... | 363/16 |
| 5,770,940 A * | 6/1998 | Goder | ........................... | 323/282 |
| 6,462,962 B1 * | 10/2002 | Cuk | .................................. | 363/16 |
| 7,141,958 B2 * | 11/2006 | Saitoh | ........................... | 323/299 |
| 7,782,027 B2 * | 8/2010 | Williams | ...................... | 323/266 |
| 2010/0171473 A1 | 7/2010 | Kazama | | |
| 2011/0018512 A1 | 1/2011 | Horii | | |

FOREIGN PATENT DOCUMENTS

JP    A-2010-51126    3/2010

OTHER PUBLICATIONS

Hiroshi Mochikawa et al., "Innovative Circuit Technology for More compact and Effective Inverters," *Toshiba Review*, vol. 61, No. 11, 2006 (English abstract included).

* cited by examiner

*Primary Examiner* — Eduardo Colon Santana
(74) *Attorney, Agent, or Firm* — Posz Law Group, PLC

(57) ABSTRACT

A power conversion apparatus includes main circuits, in which switching elements are connected in parallel with diodes, respectively. An auxiliary circuit, which is formed of a series-connected second switching element and a capacitor, is connected in parallel with the diode operating as a freewheeling diode. The switching element of the main circuit, which is opposite to the auxiliary circuit, is set to turn on at a reference time. The second switching element of the auxiliary circuit is set to turn on in advance of the reference time by an interval of a discharging time period of the capacitor in a dead time period.

18 Claims, 14 Drawing Sheets

POWER CONVERSION APPARATUS

CROSS REFERENCE TO RELATED APPLICATION

This application is based on and incorporates herein by reference Japanese patent application No. 2011-48073 filed on Mar. 4, 2011.

TECHNICAL FIELD

The present disclosure relates to a power conversion apparatus for a DC power source, which uses switching elements such as power MOSFETs.

BACKGROUND TECHNOLOGY

An inverter, a DC-DC converter or the like is used as a power conversion apparatus for a DC power source, which uses switching elements such as power MOSFETs.

One exemplary power conversion apparatus is shown and indicated by a reference numeral 90 in FIG. 14A. The power conversion apparatus 90 includes a half-bridge circuit, which forms a basic part of one phase of an inverter circuit. The half-bride circuit includes a high-side switching element SW1 and a low-side switching element SW2. By operating the switching elements SW1 and SW2 complementarily, a DC voltage E1 is converted into an AC voltage to supply electric power to an inductive load LD.

As the switching elements SW1 and SW2, a power MOSFET (metal oxide semiconductor field effect transistor), an IGBT (insulated gate bipolar transistor), a SJ-MOSFET (super junction MOSFET) or the like may be used. The switching elements SW1 and SW2 have parasitic diodes D1 and D2, which are body diodes, respectively. When the inductive load LD is driven, the parasitic diodes D1 and D2 function as freewheeling diodes. However the parasitic diodes D1 and D2 generally have poor reverse recovery characteristics. As a result, a large reverse recovery current flowing in reverse in the diode at time of reverse recovery is generated, and a surge voltage and resonance, which is referred to as ringing, are induced.

The power conversion apparatus 90 operates as shown in FIG. 14B, in which rise characteristics of a current IS1 and a voltage V2 developed when the switching element SW1 is turned on are shown in an enlarged manner. In the inverter circuit, to prevent the switching elements SW1 and SW2 from turning on at the same time and causing a short circuit of the power source, a period of about a few microseconds (μs) is provided normally as a dead time period (ΔTd) as shown in FIG. 14B. When the switching element SW1 is turned on under a condition that the freewheeling current is flowing during the dead time period ΔTd in the forward direction from the inductive load LD to the parasitic diode D2, a load current is switched to a current IS1, which flows to the switching element SW1. In this instance, a voltage in the reverse direction is applied to the parasitic diode D2. As a result, as shown by waveforms of the current IS1 and the voltage V2 in FIG. 14B, a large reverse recovery current is superposed and a current surge and a voltage surge are generated. Even after minority carriers in the parasitic diode D2 disappeared and the parasitic diode D2 is turned off, a ringing (continuing resonance) is generated due to a parasitic inductance and a parasitic resistance of conductive wires and capacitances of the switching element SW1 and the parasitic diode D1.

One example of an apparatus, which solves the above-described drawbacks of the reverse recovery current, is disclosed in the following patent document 1 as a switching power source apparatus, which includes a main oscillation element TR1 and a synchronous rectification element.

Patent document 1: JP 2009-273230A (US 2011/0018512)

The patent document 1 discloses a switching power source apparatus 20 shown in 15A and 15B, which show operation states in periods TD and TE shown in FIG. 15C. This apparatus 20 is configured to suppress a recovery current.

The switching power supply apparatus 20 converts an input voltage into a desired DC voltage to supply the load LD with electric power. It includes a main oscillation element TR1 connected in series with an input power source E, a synchronous rectification element SR1 turned on and off complementarily and a parasitic diode DSR1, which is connected to both ends of the synchronous rectification element SR1 in a direction to supply a current to a smoothing circuit 16 formed of series-connected inductor Lo and capacitor Co. At both ends of the parasitic diode DSR1, a rectification assist circuit 22 is provided. The rectification assist circuit 22 is formed of a series circuit of an auxiliary switching element Q1 and an auxiliary capacitor C1, which is driven by a control circuit (not shown). The main oscillation element TR1, the synchronous rectification element SR1 and the auxiliary switching element Q1 are controlled by controls pulses Vga, Vgb and Vgc shown in FIG. 15C. The signal levels of the control pulses Vga, Vgb and Vgc, and hence the on/off states of the elements TR1, SR1 and Q1 are controlled to change in each cycle period, which is formed of periods TA, TB, TC, TD and TE indicated in FIG. 15C.

In the switching power supply apparatus 20, the main oscillation element TR1 is turned off by the control pulse Vga and the synchronous rectification element SR1 is turned on by the control pulse Vgb in the period TD as shown in FIG. 15A. The auxiliary switching element Q1 remains turned off by the control pulse Vgc. When the main oscillation element TR1 is turned off from the on-state, the inductor Lo generates a counter-electromotive force. As shown by a dotted-line arrow in FIG. 15A, a current thus flows in a path, which is formed of the capacitor Co, the load LD and the synchronous rectification element SR1. Thus, electromagnetic energy charged in the inductor Lo during the on-state of the main oscillation element TR1 is discharged. Since the on-resistance of the synchronous rectification element SR1 is small, no forward current flows in the parasitic diode DSR1 in the forward direction. This forward direction is for charging the reverse recovery charge, which causes the reverse recovery current.

At the time of change from the period TD to the period TE in the timing chart of FIG. 15C, the synchronous rectification element SR1 is also turned off from the on-state and enters the dead time period state while the main oscillation element TR1 remains turned off. In response to a timing of turning off of the synchronous rectification element SR1, the auxiliary switching element Q1 is turned on at the same time as shown or after a slight delay, which may not be recognizable in the figure. This slight delay is provided so that the timing, at which the auxiliary switching element Q1 is substantially turned on after the synchronous rectification element SR1 has been substantially turned off, is not reversed. The slight delay is determined as a function of operation speed of the synchronous rectification element SR1 and the auxiliary switching element Q1 as well as a parasitic inductance and a parasitic capacitance of wiring patterns on a circuit substrate (not shown). This slight delay is regulated to be in the range from zero (0) to the dead time period ΔTd.

In the operation in the period TE, as shown in FIG. 15B, the current flows through the auxiliary switching element Q1. The auxiliary capacitor C1 is charged to a voltage, which is generally equal to the power source voltage, discharges and supplies a current in a different path indicated by the dotted-line arrow in FIG. 15B. The current passes through the auxiliary switching element Q1, the inductor Lo, the capacitor Co and the load LD. The auxiliary capacitor C1 has a capacitance of more than a predetermined value. Therefore, even when a part of electric charge is discharged by the above-described discharging, the voltage between its both ends is maintained to be higher than a predetermined voltage. The auxiliary capacitor C1 thus continues its discharge operation, and the forward current, which causes the reverse recovery current does not flow in the parasitic diode DSR1.

In the switching power supply apparatus 20, a route, in which the discharge current of the charged capacitor Co flows to the load LD, is formed at the earliest possible time during the dead time period so that no load current is allowed to flow in the parasitic diode DSR1. By thus preventing the charged carriers from remaining in the parasitic diode DSR1 when the synchronous rectification element SR1 remains turned off, the reverse recovery current is prevented from flowing when the main oscillation element TR1 is turned on.

In the switching power supply apparatus 20, the forward current, which causes the reverse recovery current, is prevented from flowing to the parasitic diode DSR1 in the operation in the period TE. As a result, the current surge and the voltage surge caused by the large reverse recovery current described with reference to FIG. 14B can be suppressed.

In the switching power supply apparatus 20, the current is continuously supplied to the path indicated by the dotted-line arrow in the operation in the period TE during the dead time period as shown in FIG. 15B. Accordingly the auxiliary capacitor C1 need to have a large capacitance and hence a large loss arises in the auxiliary capacitor C1. Particularly, in the switching power supply apparatus, in which a time constant switching circuit of a resistor and a diode is provided in a rectification assist circuit to mitigate a current stress applied to the main oscillation element TR1 and the like, loss is caused by resistors of the time constant switching circuit during the dead time period.

Patent document 1 further discloses to provide a slight delay so that the auxiliary switching element Q1 is protected from shorting, which is caused by reversal of the timing of turning off of the synchronous rectification element SR1 and the timing of turning on of the auxiliary switching element Q1. However, an optimum value of such a slight delay depends on values of the parasitic inductance and the parasitic capacitance. It is difficult to optimally control to turn on the auxiliary switching element Q1 in response to the timing of turning off of the synchronous rectification element SR1 as performed in the switching power supply apparatus 20. It is also not preferred from the standpoint of safety.

SUMMARY

It is therefore an object to provide a power conversion apparatus for a DC power source using switching elements. This power conversion apparatus suppresses a current surge and a voltage surge caused by a reverse recovery current, performs safe and optimum control and reduces loss in a dead time period.

For attaining the object, a power conversion apparatus for supplying electric power of a DC power source to an inductive load after conversion is formed of a set of main circuits, an auxiliary circuit and a control circuit. The main circuits are connected in series and connected to the DC power source at a high side and a low side of the DC power source to supply the electric power from a junction between the main circuits. Each of the main circuits includes a main switching element and a diode connected in parallel between both ends of the main switching element. The auxiliary circuit includes an auxiliary switching element and a capacitor connected in series with the auxiliary switching element. The auxiliary circuit is connected in parallel to one of the main circuits including the diode as a freewheeling diode. The control circuit turns on the main switching elements in the main circuits alternately with a dead time period at a time of switching so that both of the main switching elements are turned off during the dead time period. The control circuit further turns on the auxiliary switching element in the dead time period to discharge the capacitor. The control circuit turns on the auxiliary switching element in advance of a reference time by an interval of a discharging time period of the capacitor in the dead time period. The reference time is a time point, at which the main switching element of another one of the main circuits is turned on under a condition that the main switching element of the one of the main circuit is in an off-state.

EMBODIMENTS

Figure 1A:
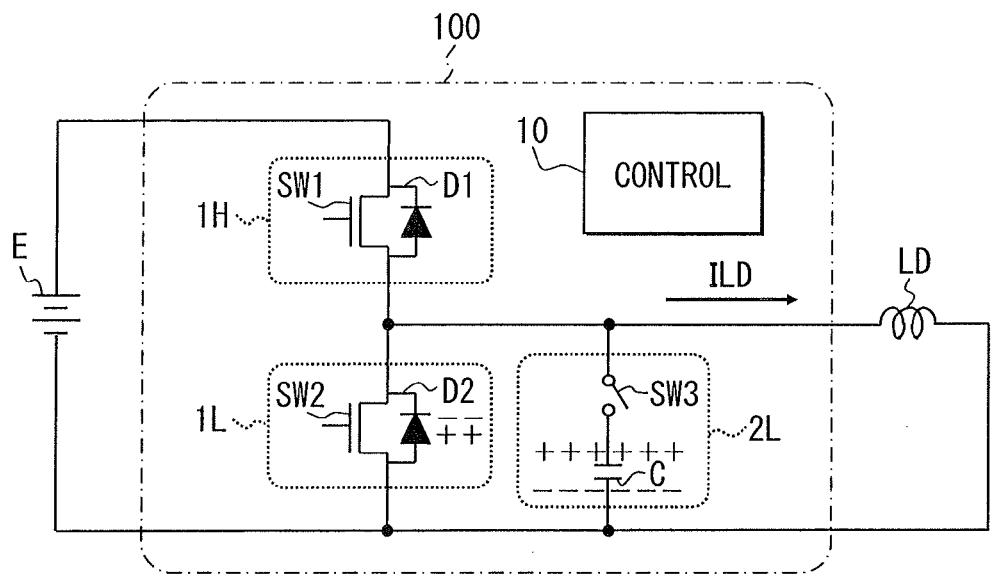
FIGS. 1A and 1B are a circuit diagram showing a major part of a power conversion apparatus, and a time chart showing a one cycle operation of the power conversion apparatus shown in FIG. 1A, respectively.

Referring to FIG. 1A showing a half-bridge circuit, which is a basic part of one phase of an inverter circuit, a power conversion apparatus 100 is indicated by a one-dot chain line. The power conversion apparatus 100 may be applied to an inverter for inverting DC power to AC power or to a DC-DC converter.

The power conversion apparatus 100 has a set of (two) main circuits 1H and 1L, which are connected in series to each other and controlled by a control circuit 10. The main circuits 1H and 1L are provided at a high-potential side and a low-potential side of the DC power source E, respectively. The power conversion apparatus 100 converts the electric power of the DC power source E to supply electric power to an inductive load LD under control by the control circuit 10. A load current ILD flows in a direction from a junction between the main circuits 1H and 1L.

Figure 1B:
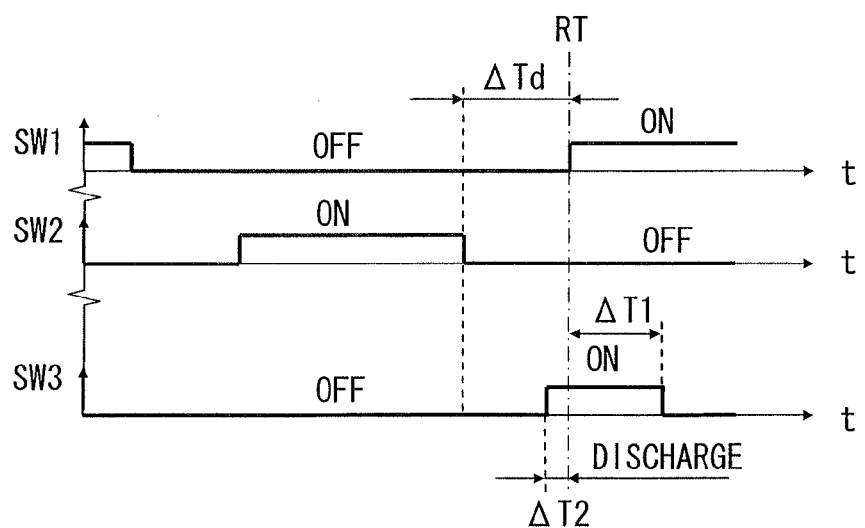

The main circuits 1H and 1L include a high-side main switching element SW1 and a low-side main switching element SW2, respectively, as first switching elements. Each of the switching elements SW1 and SW2 may be, for example, a power MOSFET, an IGBT, a SJ-MOSFET or the like. The main circuits 1H and 1L also include diodes D1 and D2, respectively. The diodes D1 and D2 are connected in parallel to both ends of the switching elements SW1 and SW2 in the reverse-bias direction. The switching elements SW1 and SW2 in the set of main circuits 1H and 1L are switching-controlled to turn on alternately as shown in FIG. 1B. A dead time period $\Delta Td$ is provided so that both of the switching elements SW1 and SW2 are maintained in the off-state at the switching time. The diode D2 of the main circuit 1L is used as a freewheeling diode during the dead time period $\Delta Td$. The switching element SW1 in the main circuit 1H turns on at a reference time RT under a condition that the switching element SW2 of the main circuit 1L is in the off-state.

The power conversion apparatus 100 also includes an auxiliary circuit 2L, which is also controlled by the control circuit 10. The auxiliary circuit 2L is formed of an auxiliary switching element SW3, which is a second switching element, and a capacitor C is connected in parallel to the main circuit 1L including the diode D2. The power conversion apparatus 100 is configured such that the switching element SW3 in the auxiliary circuit 2L is turned on in advance of the reference time RT by an amount of discharging time period $\Delta T2$ of the capacitor C during the dead time period $\Delta Td$. The capacitor C is charged during a charging time period $\Delta T1$ by using the on-state of the switching element SW1.

The diodes D1 and D2 connected in parallel and in reverse-biased direction between both ends of the switching elements SW1 and SW2 in the set of main circuits 1H and 1L, respectively, may be diodes externally connected to the switching elements SW1 and SW2 or parasitic diodes parasitic in the switching elements SW1 and SW2. In case of using the parasitic diodes of the switching elements SW1 and SW2, size reduction and cost reduction can be realized in comparison to a case of using the external diodes.

The power conversion apparatus 100 supplies electric power to the inductive load LD by operating the switching elements SW1 and SW2 complementarily. In this operation, the dead time period $\Delta Td$ of about a few microseconds (ps) is provided as shown in FIG. 1B so that both of the first switching elements SW1 and SW2 remain in the off-state to prevent the DC power source E from being short-circuited through the main circuits 1H and 1L. The diode D2, which is connected in parallel and reverse-biased to the switching element SW2, is used to function as the freewheeling diode during the dead time period $\Delta Td$ after the switching element SW2 is turned off. That is, during the dead time period $\Delta Td$, the current is allowed to flow from the inductive load LD in the forward-biased direction of the diode D2 so that the load current ILD continues to flow.

Figure 14A:
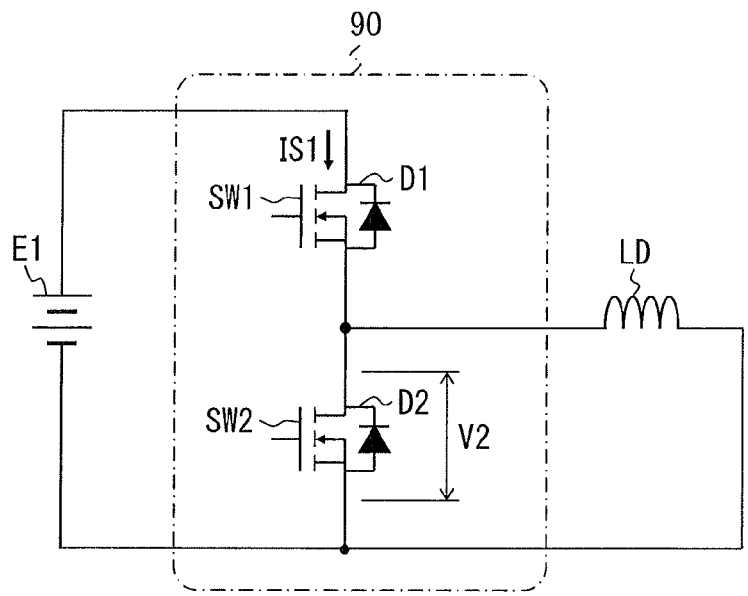
FIGS. 14A and 14B are a circuit diagram showing a half-bridge circuit, which is a basic part for one-phase part of a conventional power conversion apparatus, and a time chart showing a one cycle operation of the power conversion apparatus shown in FIG. 14A.
Figure 14B:
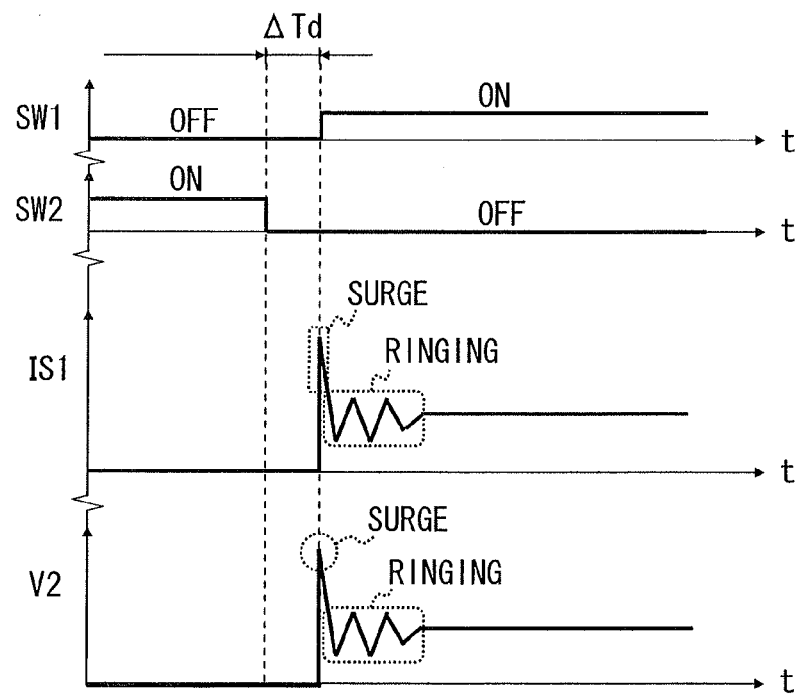

As described with reference to the power conversion apparatus 90 shown in FIG. 14A, the large freewheeling current flows in the diode D2 operating as the freewheeling diode during the dead time period $\Delta Td$ and the large amount of charges (reverse recovery charges) are being charged (stored or accumulated). When the switching element SW1 turns on under this condition, the load current is switched to the current, which flows in the switching element SW1. The voltage is applied in the reverse direction to the diode D2 having operated as the freewheeling diode and the reverse recovery current of the stored reverse recovery charge flows. As a result, the reverse recovery current is superposed on the current of the switching element SW1, which is turned on, and the current surge and the voltage surge arise as shown in FIG. 14B. Further, the resonance, which is referred to as the ringing, is induced. The reverse recovery current becomes a large power loss. These are main factors, which obstruct improvement in the power conversion efficiency. In case of using the parasitic diodes, which are parasitic in the elements SW1 and SW2, as the diodes D1 and D2, the poor reverse recovery characteristic of the parasitic diode causes a large power loss.

The power loss may be reduced by use of a fast recovery diode, whose recovery (reverse recovery) time is designed to be short, or by prevention of the current surge and the voltage surge. However, this counter-measure for the reverse recovery current is costly or insufficient to suppress power loss. The ringing is not mitigated yet.

The auxiliary circuit 2L therefore is formed of the switching element SW3 and the capacitor C, which are connected in series to each other. The auxiliary circuit 2L is connected in parallel to the main circuit 1L including the diode D2 as the freewheeling diode. The switching element SW3 is driven as shown in FIG. 1B. That is, the switching element SW3 is turned on in advance of the reference time RT by the interval of the discharging time period $\Delta T2$ of the capacitor C during the dead time period $\Delta Td$. The reference time RT is the timing, at which the switching element SW1 in the main circuit 1H turns on under the condition that the switching element SW2 of the main circuit 1L is in the off-state.

When the switching element SW2, to which the auxiliary circuit 2L is connected in parallel, turns off from the on-state and the dead time period $\Delta Td$ shown in FIG. 1B starts, the current flows in the forward direction of the diode D2 and the reverse recovery charges are stored in the diode D2. These charges are indicated by positive signs (+) and negative signs (−) in FIG. 1A. However, it is possible to pre-charge the capacitor C of the auxiliary circuit 2L as indicated by six signs, + and −, respectively, in FIG. 1A and turns on the switching element SW3 to discharge the pre-charged charges in the discharging time period $\Delta T2$, which precedes the reference time RT during the dead time period. Thus, the reverse recovery charges stored in the diode D2 in the initial period of the dead time period $\Delta Td$ can be extinguished in the discharging time period $\Delta T2$ in the last interval of the dead time period $\Delta T2$. That is, the reverse recovery charges can be extinguished by increasing the discharge current flowing from the capacitor C to the diode D2 to be larger than the freewheeling current flowing in the diode D2 in the forward direction and reducing the freewheeling current to 0. As a result, even when the switching element SW1 turns on at the reference time RT, the current surge and the voltage surge are not caused by the reverse recovery charges and the power loss caused by the reverse recovery current can be eliminated.

In the power conversion apparatus 100, as the switching element SW1 turns on with the switching element SW3 being in the on-state, the current flows from the power source E to GND through the switching element SW1 in the on-state and the auxiliary circuit 2L. Since the capacitor C is provided in the auxiliary circuit 2L in this current loop, continuation of the resonance (ringing) caused by the parasitic inductance on a circuit substrate is reduced in comparison to a case, in which the auxiliary circuit 2L is not provided. In comparison to the case that the capacitor C is not provided, the parasitic inductance on the substrate is made to be less influential on the ringing and hence circuit wiring can be designed with more degree of freedom. When the switching element SW1 is turned on, the capacitor C is recharged and prepared to the next discharge.

Figure 15A:
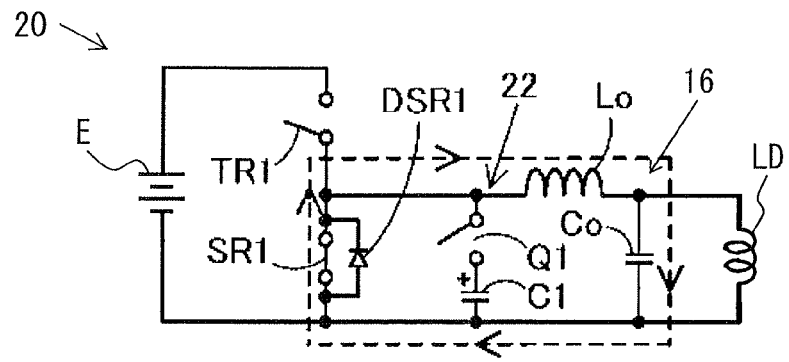
FIGS. 15A, 15B and 15C are circuit diagrams showing operation states of the conventional power conversion apparatus, and a time chart showing an operation of the conventional power conversion apparatus shown in FIGS. 15A and 15B, respectively.
Figure 15B:
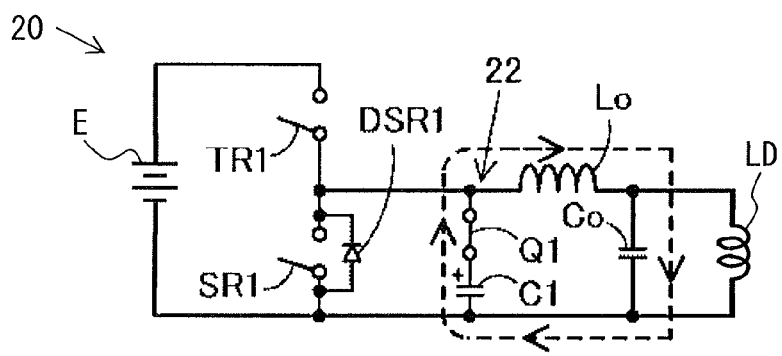
Figure 15C:
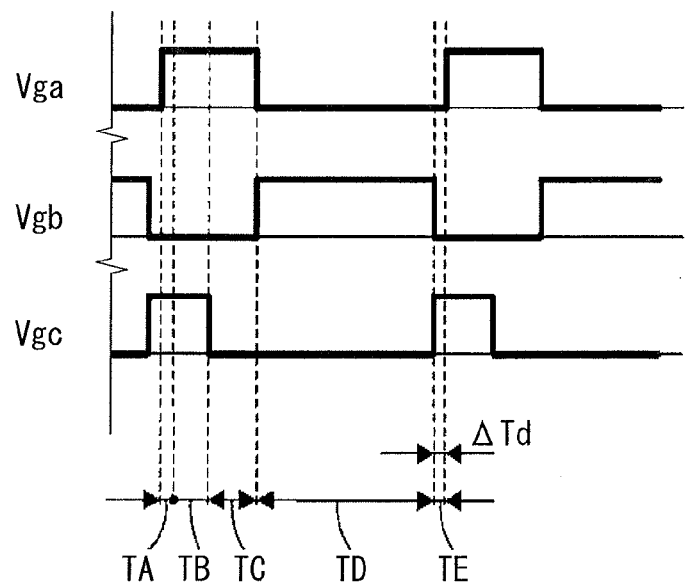

According to the power conversion apparatus 100 described above, the auxiliary circuit 2L is driven to discharge the capacitor C of the auxiliary circuit 2L in advance of the reference time RT by the interval of the discharging time period $\Delta T2$ during the dead time period $\Delta Td$. As a result, the charges pre-stored in the capacitor C are used as much as possible only to cancel the reverse recovery charges stored in the diode D2. The capacitor C of the auxiliary circuit 2L may have only a smaller capacitance than that of the auxiliary capacitor C1 of the switching power supply circuit 20 shown in FIGS. 15A and 15B. The drive control in the power conversion apparatus 100 shown in FIG. 1B can shorten the time, in which the current flows in the capacitor C of the auxiliary circuit 2L, in comparison to the drive control in the conventional switching power supply apparatus 20 shown in FIGS. 15A and 15B. For this reason, the loss caused by the capacitor C of the auxiliary circuit 2L during the dead time period can be reduced and minimized in comparison to the conventional switching power supply apparatus 20. The drive control in the power conversion apparatus 100 is optimized easily as described below and safety can be maintained even when the discharging time period $\Delta T2$ and the discharge charges vary.

The power conversion apparatus 100 repeats the cycle shown in FIG. 1B to convert the power of the DC power source E and supply the converted power to the load LD. A sequence of operation of the power conversion apparatus 100 in each cycle will be described in detail with reference to FIGS. 2A to 5C.

Figure 2A:
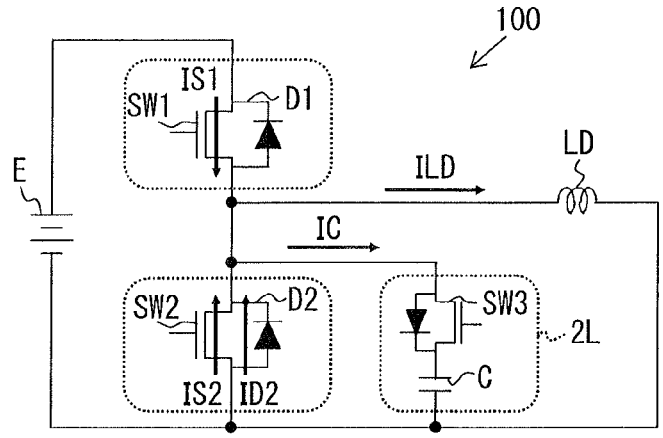
FIG. 2A and 2B are a circuit diagram showing a detailed configuration of the power conversion apparatus shown in FIG. 1A, and a time chart showing a repetition of control cycles of the power conversion apparatus shown in FIG. 2A, respectively.

As shown in FIG. 2A, it is preferred that the switching element SW3 is formed of the insulated gate transistor as the switching elements SW1 and SW2 are to reduce manufacturing cost. It is also preferred that the switching element SW3 is also formed of the insulated gate transistor, which has generally the same level of withstanding voltage. The switching elements SW1 and SW2 are generally required to have performance characteristics such as high speed switching, small reverse recovery charge, withstanding voltage and withstanding current. The switching element SW3 is only required to have performance characteristics related to the withstanding voltage and the withstanding current. The performance characteristics related to the switching speed and the reverse recovery charge are not so critical. In this case, however, the parasitic diode of the switching element SW3 need be connected in the direction shown in FIG. 2A.

A sequence of operation of the power conversion apparatus 100 at time points ta1, tb, tc, td, te, tf1, tf2 and ta2 shown in FIGS. 3A to FIG. 5C will be described with reference to time charts shown in FIG. 2B.

Figure 2B:
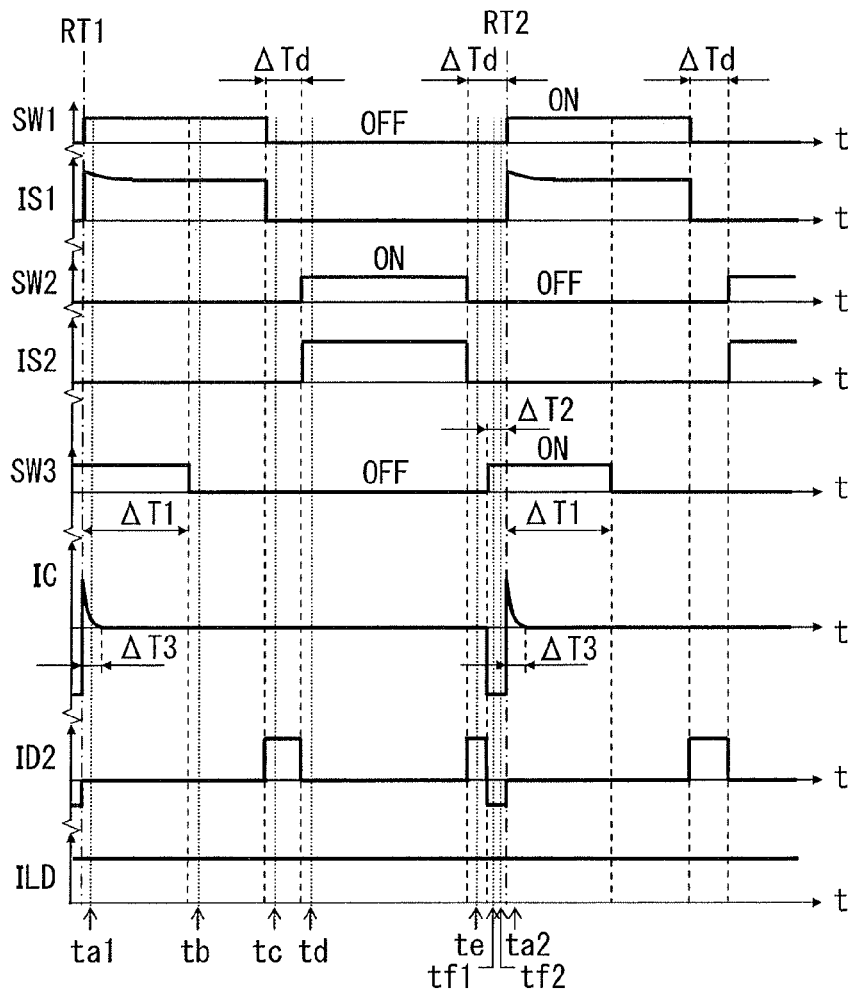
Figure 3A:
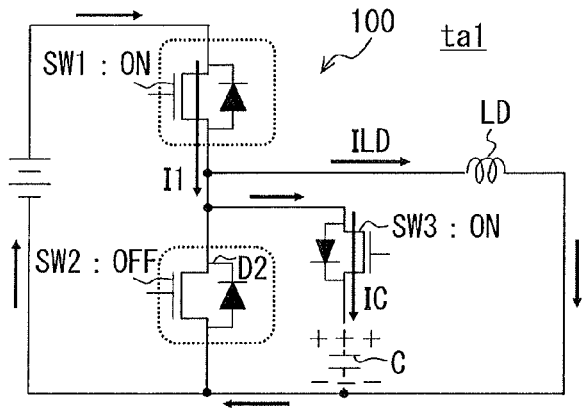
FIGS. 3A, 3B and 3C are circuit diagrams showing current flow states at time points ta1, tb and tc indicated in FIG. 2B, respectively.

At time point ta1 in FIG. 2B, the power conversion apparatus 100 takes a state shown in FIG. 3A. This state is immediately after a reference time RT1, at which the switching element SW1 is turned on. As shown in FIG. 2B, the switching element SW1 is in the on-state, the switching element SW2 is in the off-state and the switching element SW3 is in the on-state. In this state, the current IS1 flowing in the switching element SW1 is supplied to the load LD as the load current ILD. A part of the current IC flows to the capacitor C as the charging current for the capacitor C. The capacitor C is chargeable in the period $\Delta T1$ from the reference time RT1 shown in to turning off of the switching element SW3. However, the charging is completed within a very short period $\Delta T3$ shown in FIG. 2B and the current IC flowing to the capacitor C becomes 0 thereafter.

Figure 3B:
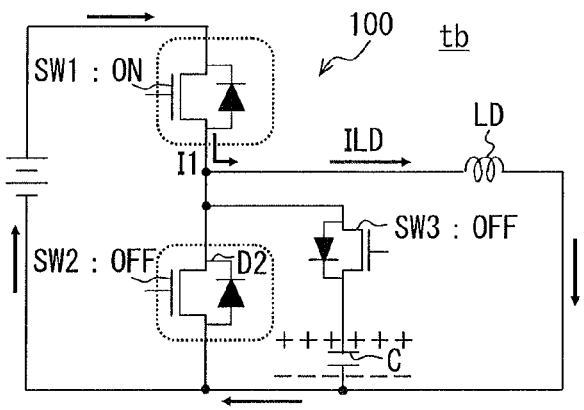

At time point tb in FIG. 2B, the power conversion apparatus 100 takes a state shown in FIG. 3B. This state is immediately after the switching element SW3 is turned off. In this state, the switching element SW1 is in the on-state, the switching element SW2 is in the off-state and the switching element SW3 is in the off-state. In this state, the charging of the capacitor C is completed as described above, the load current ILD flowing through the charged state of the capacitor C and the switching element SW1 does not change even when the switching element SW3 is turned off.

Figure 3C:
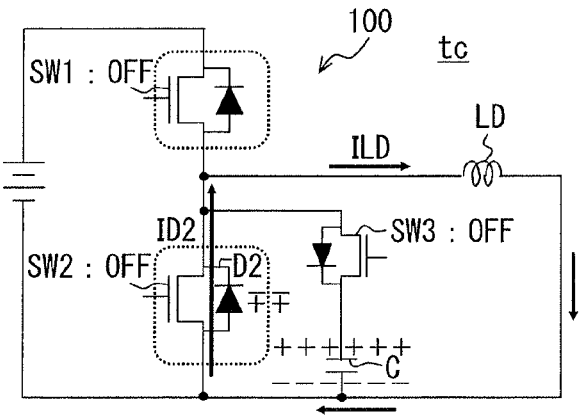

At time point tc in FIG. 2B, the power conversion apparatus 100 takes a state shown in FIG. 3C. This state is immediately after turning off of the switching element SW1. The switching element SW1 is in the off-state, the switching element SW2 is in the off-state and the switching element SW3 is in the off-state. In this state, the diode D2 operates as the freewheeling diode in the dead time period $\Delta Td$ of the off-states of both of the switching elements SW1 and SW2. The diode D2 operates as the freewheeling diode. That is, the load current ILD continues to flow in the forward .direction in the diode D2 as the freewheeling current even after the turning off of the switching element SW1. The diode D2 is in the state, in which the large amount of charge is stored internally.

Figure 4A:
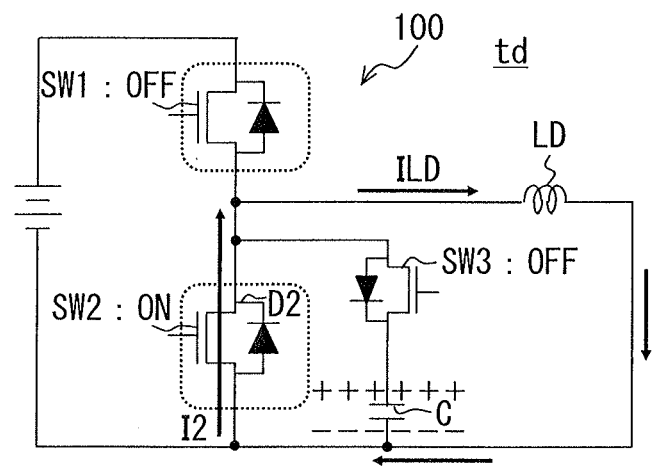
FIGS. 4A and 4B are circuit diagrams showing current flow states at time points td and Te indicated in FIG. 2B, respectively.

At time td in FIG. 2B, the power conversion apparatus 100 takes a state shown in FIG. 4A. This state is immediately after turning on of the switching element SW2 and completion of the dead time period $\Delta Td$. The switching element SW1 is in the off-state, the switching element SW2 is in the on-state and the switching element SW3 is in the off-state. In this state, the freewheeling current flowing in the diode D2 is switched to the freewheeling current flowing in the switching element SW2 so that the load current ILD continues to flow as the freewheeling current that flows through the switching element SW2. The large amount of charges, which have been charged internally by the diode D2 disappear at time point tc shown in FIG. 3C.

Figure 4B:
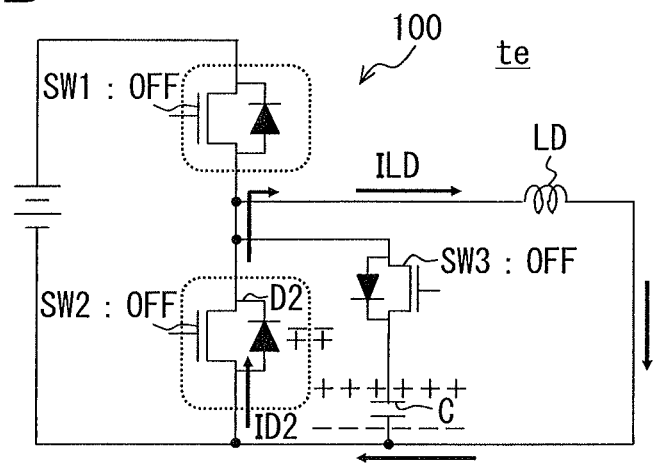

At time point to in FIG. 2B, the power conversion apparatus 100 takes a state shown in FIG. 4B. This state is immediately after turning off of the switching element SW2. The switching element SW1 is in the off-state, the switching element SW2 is in the off-state and the switching element SW3 is in the off-state. In this state, the dead time period $\Delta Td$ starts again and the diode D2 operates as the freewheeling diode. The diode D2 is thus in the state, in which the large amount of charges (reverse recovery charges) are stored (accumulated) similarly to the state of the time point tc shown in FIG. 3C.

Figure 5A:
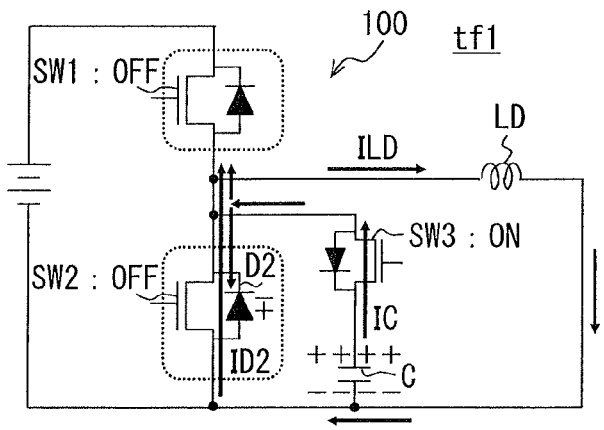
FIGS. 5A, 5B and 5C are circuit diagrams showing current flow states at time points tf1, tf2 and ta2 indicated in FIG. 2B, respectively.

At time point tf1 in FIG. 2B, the power conversion apparatus 100 takes a state shown in FIG. 5A. This state is immediately after turning on of the switching element SW3 of the auxiliary circuit 2L in the period of the dead time period ΔTd. The switching element SW1 is in the off-state, the switching element SW2 is in the off-state and the switching element SW3 is in the on-state. In this state, the charges stored in the capacitor C of the auxiliary circuit 2L are discharged so that the reverse recovery charges stored in the diode D2 at the time point to in FIG. 4B is cancelled. The current IC discharged from the capacitor C is partly branched to flow to the load LD. The current flowing toward the diode D2 becomes a current that cancels the reverse recovery charges stored in the diode D2.

Figure 5B:
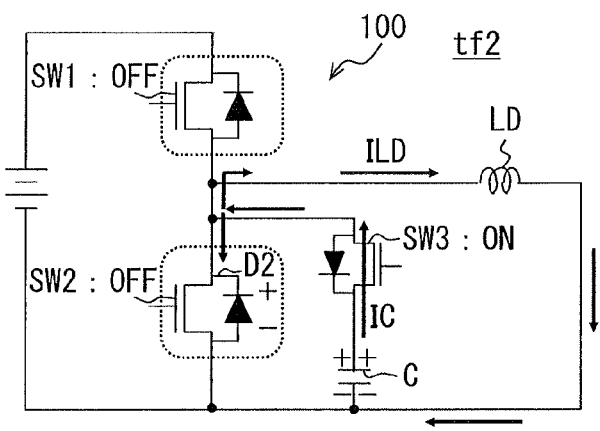

At time point tf2 in FIG. 2B, the power conversion apparatus 100 takes a state shown in FIG. 5B. This state is close to a state of a reference time RT2, at which the switching element SW1 is turned on. In this state, all the reverse recovery charges stored in the diode D2 are discharged and the reverse charges are stored to deplete the diode D2, that is, the diode D2 is charged with charges of the opposite polarity.

A discharging time period ΔT2 of the capacitor C, which precedes the reference time RT2 indicated in FIG. 2B is set to be sufficient to cancel the reverse recovery charges stored in the diode D2 but as short as possible.

Figure 5C:
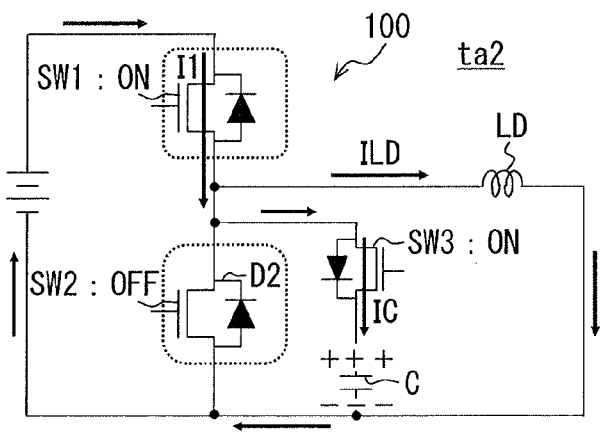

At time point ta2 in FIG. 2B, the power conversion apparatus 100 takes a state shown in FIG. 5C. This state is immediately after the reference time RT2, at which the switching element SW1 shown in FIG. 2B is turned on. This state is the same as that of the time point a1 shown in FIG. 3A after completion of control of one cycle. When the switching element SW1 turns on at the reference time RT2, the capacitor C is immediately discharged by the current IS1 flowing in the switching element SW1 and then charged further by the current IC, which flows to the capacitor C.

The above-described one cycle operation of the power conversion apparatus 100 is performed in repetition. At the time of starting the operation of the power conversion apparatus 100, the switching element SW1 and the switching element SW2 are turned on to pre-charge the capacitor C.

In the conventional apparatus shown in FIGS. 14A to 15C, when the switching element SW1 is turned on during the dead time period Sa1 under the state that the reverse recovery charges are stored in the diode D2, the current surge and the voltage surge appear as shown in FIG. 14B. According to the power conversion apparatus 100 shown in FIG. 1, the reverse recovery charges stored in the initial period of the dead time period are fully removed at the reference time RT2, at which the switching element SW1 is turned on, as shown in FIG. 5A and FIG. 5B. Therefore, as indicated by the waveform of the current IS1 shown in FIG. 2B, the current surge, the voltage surge and the continuing resonance, which are caused by the reverse recovery charges at the reference time RT2 can be suppressed and the power loss caused by the reverse recovery current can be reduced in the power conversion apparatus 100.

The drive control for the auxiliary circuit 2L shown in FIGS. 5A and 5B is performed to use the charges pre-charged in the capacitor C only to cancel the reverse recovery charges stored in the diode D2. At the time when the reverse recovery charges are cancelled, the switching element SW1 is turned on as early as possible. As a result, in comparison to the conventional switching power supply apparatus 20 shown in FIGS. 15A and 15B, the drive control of the power conversion apparatus 100 is effective to shorten the time period in which the current flows to the capacitor C of the auxiliary circuit 2L. Further, the loss in the capacitor C of the auxiliary circuit 2L during the dead time period can be reduced and minimized.

The power conversion apparatus 100 is for the DC power source E, which uses the switching elements SW1 and SW2 such as power MOSFETs.

The power conversion apparatus 100 can suppress the current surge, the voltage surge and the continuing resonance, which are caused by the reverse recovery current, can be suppressed. In addition, the power conversion apparatus 100 can perform its control safely and optimally and reduce the loss during the dead time period ΔTd in comparison to the conventional apparatus.

In the power conversion apparatus 100 shown in FIG. 1A, it is necessary to charge the capacitor C of the auxiliary circuit 2L with more charges than the reverse recovery charges stored in the diode D2 such that the reverse recovery charges stored in the diode D2 is completely extinguished by the charges pre-charged in the capacitor C of the auxiliary circuit 2L.

For this reason, it is preferred that the stored charges of the capacitor C are set to be more than the reverse recovery charges stored in the diode operating as the freewheeling diode at the time when the switching element SW3, which starts discharging of the capacitor C during the dead time period ΔTd, is turned on. It is however possible to attain the advantage of suppressing the current surge and the voltage surge caused by the reverse recovery charges even if the stored charges of the capacitor C are less than the reverse recovery charges stored in the diode D2.

It is possible to further discharge the capacitor C to store the reverse charges, which deplete the diode D2. Thus, as shown in FIG. 5B, the diode D2, which operates as the freewheeling diode is depleted at the reference time RT. As a result, a soft-switching operation can be advantageously performed to further reduce the switching loss.

The power conversion apparatus 100 may be modified as shown in FIGS. 6 to 10, which show modified power conversion apparatuses 101 to 106.

Figure 6:
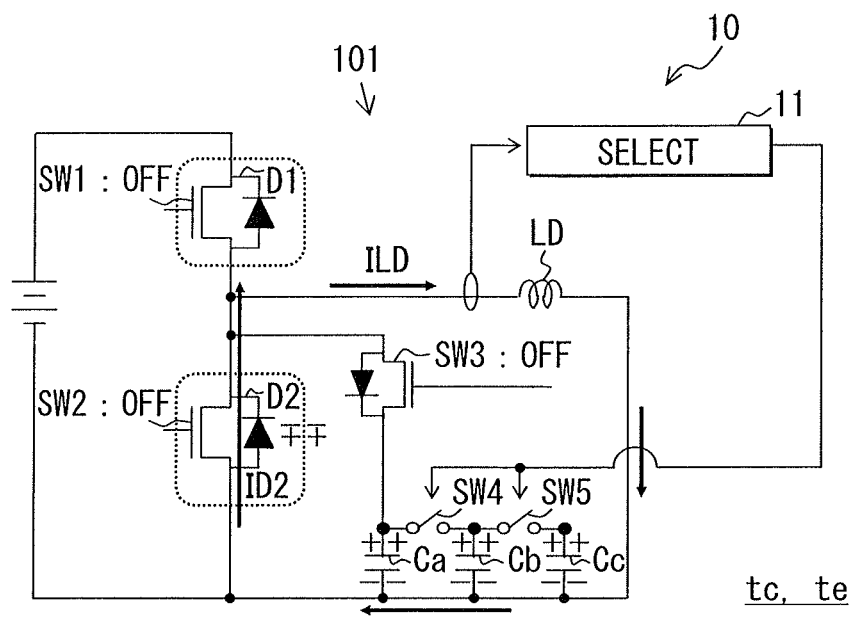
FIG. 6 is a circuit diagram showing a modification of the power conversion apparatus shown in FIG. 2A.

The power conversion apparatus 101 is shown in FIG. 6. The current flow states at the time point tc or the time point to during the dead time period ΔTd indicated in FIG. 2B are superposed on the circuit diagram.

The power conversion apparatus 101 includes a plurality of parallel-connected capacitors Ca to Cc and switching elements SW4 and SW5, which select combinations of these capacitors, in place of the capacitor C of the power conversion apparatus 100 shown in FIG. 2A. The control circuit 10 includes a selection part 11, which is so configured to select the optimum one of the combinations of the plurality of capacitors Ca to Cc to be used in the discharging time period ΔT2 before turning on the switching element SW3 by measuring the load current ILD flowing to the load LD.

The amount of discharge from the capacitor necessary to sufficiently cancel the reverse recovery charges can be optimized by selecting combinations of the plurality of capacitors Ca to Cc in correspondence to the amount of reverse recovery charges, which are stored in the diode D2 and vary with the magnitude of the load current ILD.

In the power conversion apparatuses 100 and 101, it is preferred as shown in the time chart of FIG. 2B that the switching element SW3 in the auxiliary circuit 2L is set to turn off before the switching element SW1, which turned on at the reference times RT1 and RT2, turns off. It is thus possible to switch the capacitors C and Ca to Cc from discharging to charging at the timing of turning on of the switching element SW1 at the reference times RT1 and RT2, while maintaining the switching element SW3 in the on-state. As a result, charging and discharging of the capacitors C, Ca to Cc can be controlled in a simplified manner.

Figure 7A:
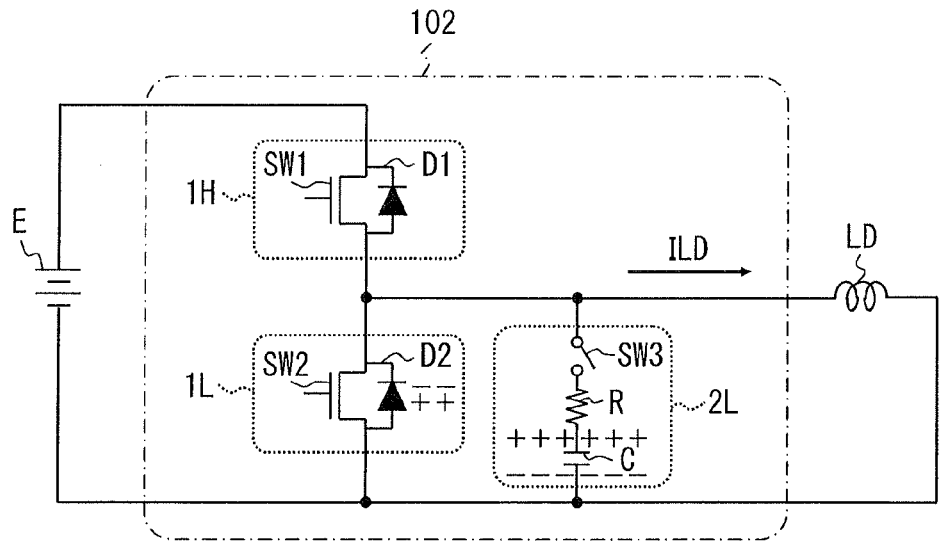
FIGS. 7A and 7B are a circuit diagram showing a modification of the power conversion apparatus shown in FIG. 1A, and a time chart showing a one cycle operation of the power conversion apparatus shown in FIG. 7A, respectively.
Figure 7B:
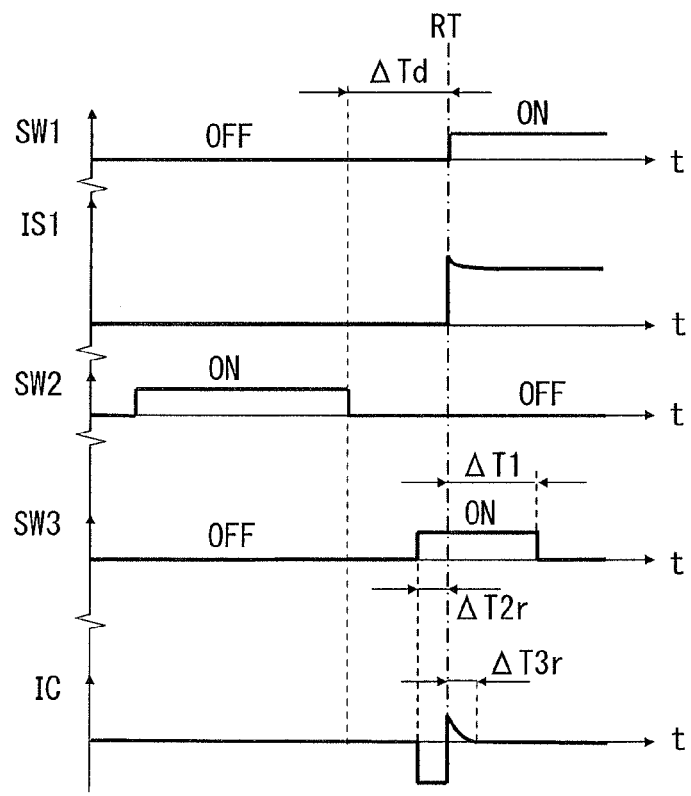

In the power conversion apparatuses 100 and 101, the discharging time period ΔT2 shown in FIG. 2B may be set to, for example, a time period shorter than one-half of the dead time period ΔTd. To prevent surely the short-circuiting of the power source E through the main circuits 1H and 1L, it is necessary to provide the dead time period ΔTd of about a few μs as described above. The discharging time period ΔT2 of the capacitors C and Ca to Cc can be set to be sufficiently shorter than the dead time period ΔTd. Therefore, it is possible to set the time of flow of current IC to the capacitors C and Ca to Cc as short as possible by setting the discharging time period of the capacitor to be shorter than one-half of the dead time period ΔTd. The power conversion apparatus 102 is shown in FIGS. 7A and 7B.

The power conversion apparatus 102 is basically configured in the similar manner as the power conversion apparatus 100. However, it is different in that a resistor R is added to the auxiliary circuit 2L. That is, differently from the power conversion apparatus 100, the resistor R is connected in series with the switching element SW3 and the capacitor C.

The resistor R is used to control the charging and discharging currents (charging and discharging time periods) of the capacitor C. That is, in the power conversion apparatus 100 including no resistor R, the discharging time period ΔT2 and the substantial discharging time period ΔT3 of the capacitor C shown in FIG. 1B and FIG. 2B are momentary. On the contrary, in the power conversion apparatus 102 including the resistor R in the auxiliary circuit 2L, the charging and discharging current IC of the capacitor shown in FIG. 7B is reduced and the discharging time period ΔT2$r$ and the substantial charging time ΔT3$r$ becomes longer. As a result, the charging and discharging of the capacitor C can be stabilized. The resistance R of the resistor R needs to satisfy a relation, that is, the power source voltage (E) divided by the resistance (R) is greater than the load current (ILD), E/R>ILD.

By providing the resistor R, the current path is formed from the DC power source E to the ground through the switching elements SW1 and SW2, in case that the switching element SW3 of the auxiliary circuit 2L and the switching element SW1 of the main circuit 1H are in the on-states (charging time of capacitor C immediately after the reference time RT). It is thus possible to reduce noise by suppressing the ringing (continuing resonance).

Even in a case that the reverse recovery charge is completely cancelled by discharging of the capacitor C in the power conversion apparatus 100, the ringing still arises because of a sharp rise of the switching element SW1, which turns on at the reference time RT, and the parasitic inductance on the substrate such as circuit wiring and leads of electronic components.

To suppress the ringing, a series resonance value Q, which indicates a characteristic of continuation of the oscillation of a resonance system, is particularly set to satisfy an over-attenuation condition Q<½ or a critical attenuation condition Q=½ by the series-connected capacitor C, the resistor R and the parasitic inductance of the wiring. Assuming that the capacitor C has the capacitance C, the resistor R has the resistance R and the parasitic inductance on the substrate is L, the combination of C, R and L is determined such that the Q value (Q=(1/R)×√(L/C)) of the series resonance satisfies the over-attenuation relation Q<½ or the critical attenuation condition Q=½. As a result, the over-attenuation is represented as a waveform indicated by the waveform of the current IS1 shown in FIG. 7B. If the series resonance Q value is Q>½, energy loss of oscillation is small the oscillation continues, the attenuation of oscillation magnitude is mitigated and the ringing arises as shown in FIG. 14B. It is preferred that C and R are large and L is small for the series resonance Q value to satisfy the over-attenuation condition Q<½(Q<<½). In case of Q>½, the attenuation oscillation occurs in the waveform shown in FIG. 14B. In case of Q=½, the critical attenuation occurs.

The resistor R becomes a loss in the discharging period of the capacitor C. However, the auxiliary circuit 2L in the power conversion apparatus 102 is driven to use the pre-charged charges of the capacitor C for only canceling the reverse recovery charges stored in the diode D2 as much as possible as described above, and the period of flow of current to the capacitor C of the auxiliary circuit 2L is shortened as much as possible. As a result, in comparison to the conventional driving method, which only switches to the current path of the auxiliary circuit (rectification assist circuit 22) as early as possible during the dead time period ΔTd, the loss caused by the resistor R can be minimized and both suppression of ringing and mitigation of loss can be attained.

Figure 8A:
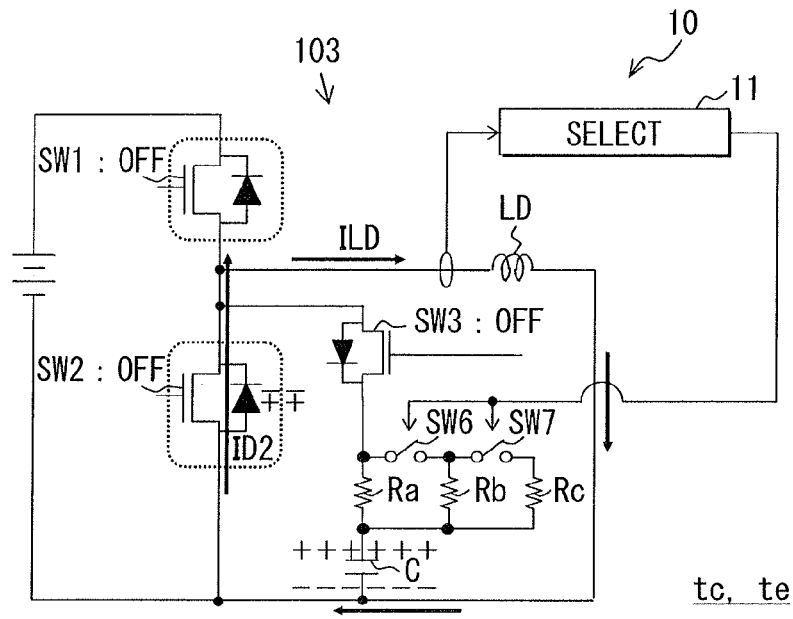
FIGS. 8A and 8B are circuit diagrams showing modifications of the power conversion apparatus shown in FIG. 7A.
Figure 8B:
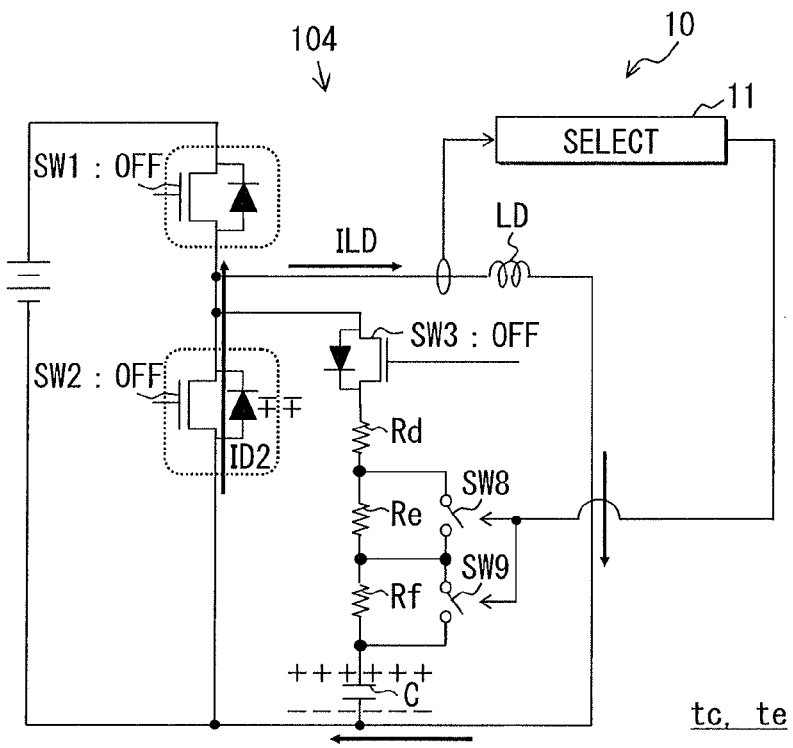

The power conversion apparatuses 103 and 104 are shown in FIGS. 8A and 8B, respectively. The power conversion apparatus 103 shown in FIG. 8A includes a plurality of parallel-connected resistors Ra to Rc and switching elements SW6 and SW7, which select combinations of these resistors Ra to Rc under control by the selection part 11 of the control circuit 10. The power conversion apparatus 104 shown in FIG. 8B includes a plurality of series-connected resistors Rd to Re and switching elements SW8 and SW9, which select combinations of these resistors under control of the selection part 11 of the control circuit 10. That is, the power conversion apparatuses 103 and 104 are so configured to select the optimum one of the combinations of the plurality of resistors Ra to Rc and Rd to Re to be used in the discharging time period ΔT2 before turning on the switching element SW3 during the dead time period ΔTd by measuring the load current ILD flowing to the load LD.

According to the power conversion apparatuses 103 and 104, both of the magnitude of the discharge current IC necessary to sufficiently cancel the reverse recovery charges in the predetermined discharging time period ΔT2 and the suppression of ringing can be optimized by selecting combinations of the plurality of resistors Ra to Rc and Rd to Re in correspondence to the amount of reverse recovery charges, which are stored in the diode D2 and vary with the magnitude of the load current ILD.

It is possible to select the optimum one of the combinations of the plurality of capacitors Ca to Cc and the plurality of resistors Ra to Rc and Rd to Re by combining the configuration of the power conversion apparatus 101 having the plurality of capacitors Ca to Cc shown in FIG. 6 and the configuration of the power conversion apparatuses 103 and 104 having the plurality of resistors Ra to Rc and Rd to Re shown in FIGS. 8A and 8B.

Figure 9:
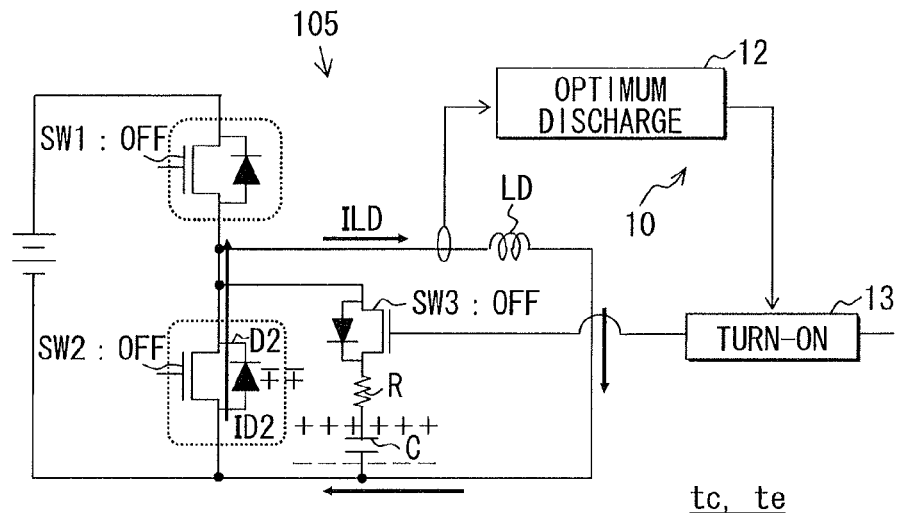
FIG. 9 is a circuit diagram showing a modification of the power conversion apparatus shown in FIG. 7A.

The power conversion apparatus 105 is shown in FIG. 9. The power conversion apparatus 105 is so configured that the control circuit 10 includes an optimum discharging time calculation part 12 and a turn-on control part 13. The calculation part 12 measures the load current ILD flowing to the load LD and determines the optimum timing of turning on of the switching element SW3. The control part 13 controls the switching element based on the determined optimum turn-on timing. The discharging time ΔT2 for canceling the reverse recovery charges can be optimized always, even when the load current ILD changes with time and the amount of the reverse recovery charges stored in the diode D2 also changes with time.

Figure 10:
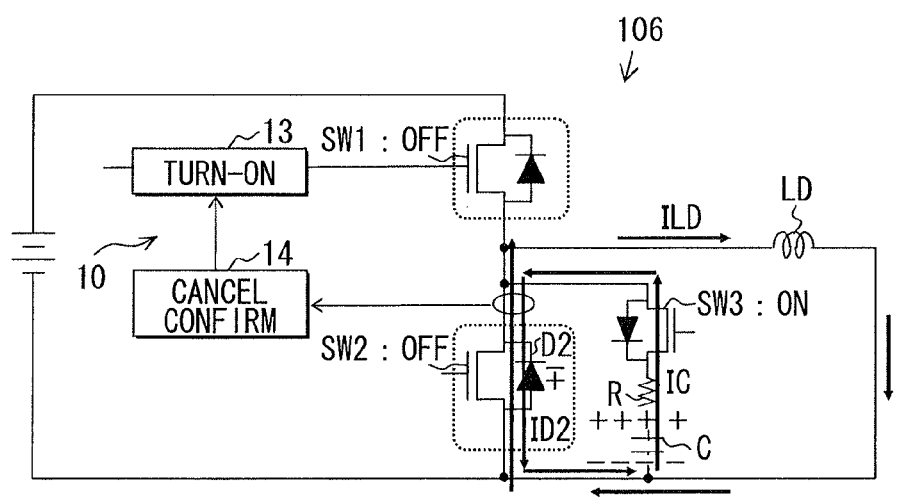
FIG. 10 is a circuit diagram showing a modification of the power conversion apparatus shown in FIG. 7A.

The power conversion apparatus 106 is shown in FIG. 10. In the power conversion apparatus 106, the turning on of the switching element SW1 is controlled during the dead time period ΔTd by measuring the current flowing to the diode D2 operating as the freewheeling diode. That is, the switching element SW1 is turned on after confirming by a cancel confirmation part 14 of the control circuit 10 that the current ID2 flowing to the diode D2 operating as the freewheeling diode by the discharge current IC of the capacitor C is reduced and the current ID2 is reduced to 0 by cancellation of the reverse recovery charges after the switching element SW3 of the auxiliary circuit is turned on. It is thus possible to optimize the suppression of current surge and voltage surge as well as the suppression of loss in the capacitor C (and resistor R) during the dead time period ΔTd in comparison to the case, in which the reference time RT and the discharging time period ΔT2 are preset. This method is particularly effective when the load current ILD varies with time.

Figure 11A:
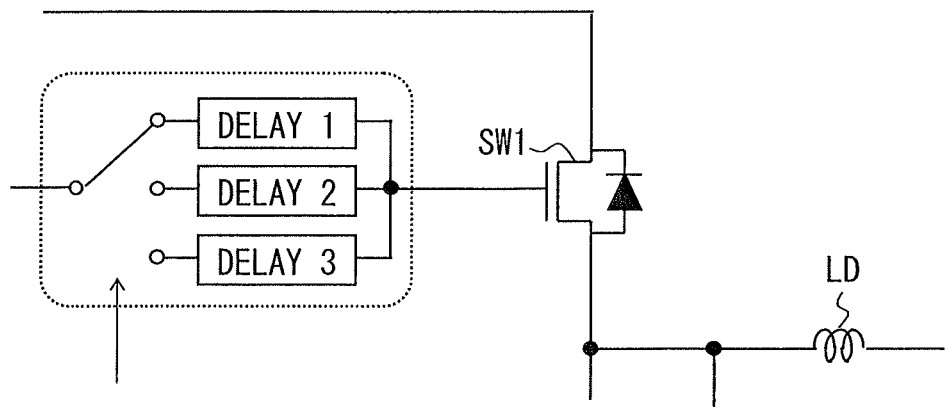
FIGS. 11A, 11B and 11C are circuit diagrams of exemplary parts, which are used in the modification shown in FIG. 10.
Figure 11B:
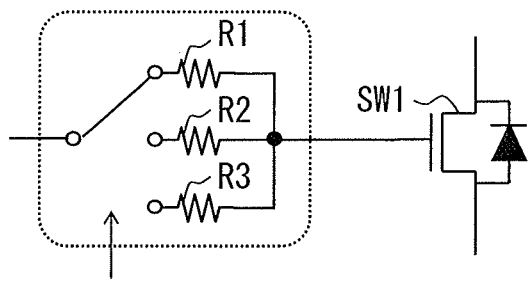
Figure 11C:
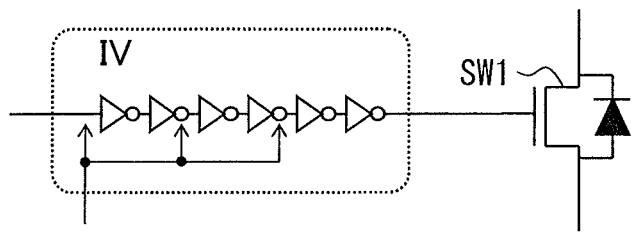

Exemplary configurations of a circuit, which controls turning on of the switching element SW1 are shown in FIGS. 11A to 11C. FIG. 11A shows a case, in which delay circuits of different delay times are selectively provided to turn on the switching element SW1. FIGS. 11B shows a case, in which resistors R1 to R3 of different resistance values are selectively provided for delay selection. FIG. 11C shows a case, in which series-connected logic inverters IV are selectively provided for delay selection. The configurations shown in FIGS. 11A to 11C may also be used to control turning on of the switching element SW3 shown in FIG. 9.

The power conversion apparatuses 100 to 106 are operable at high frequencies and applicable to inverters, which convert DC power to AC power. The power conversion apparatuses 100 to 106 are also operable with high power. Exemplary applications of the power conversion apparatuses 100 to 106 will be described with reference to cases, which use a three-phase induction motor as a load.

Figure 12:
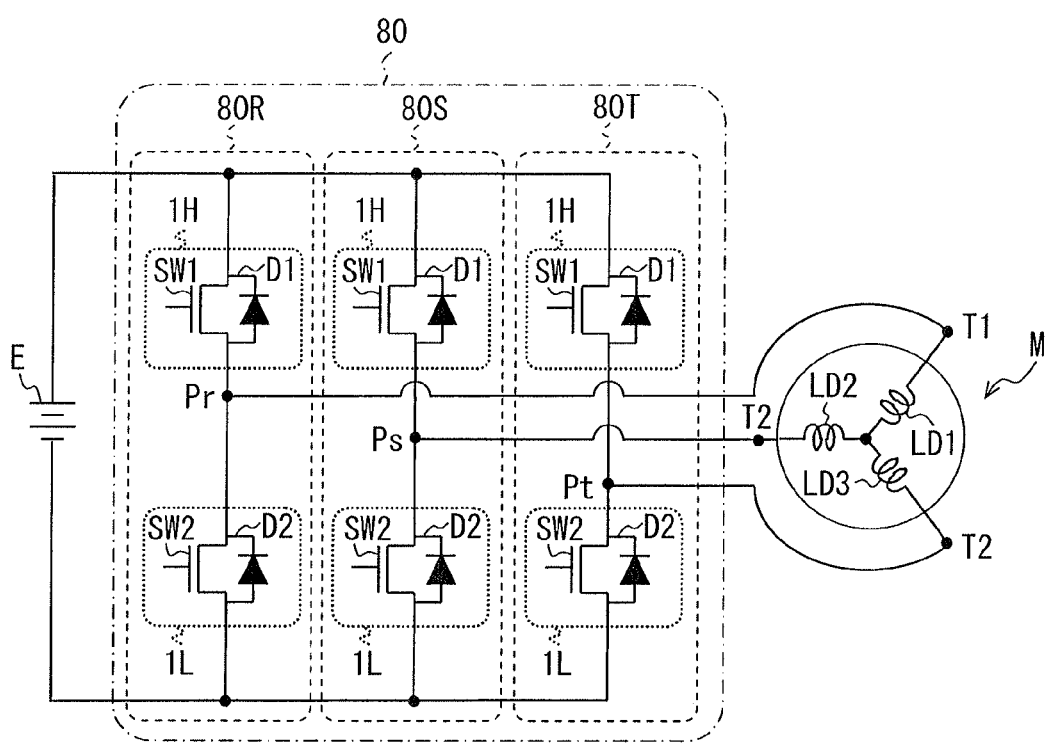
FIG. 12 is a circuit diagram of an inverter used as a power conversion apparatus for driving a three-phase induction motor.

An inverter is shown in FIG. 12 as a power conversion apparatus 80 for driving a three-phase induction motor M. The inverter has the main circuits 1H and 1L in three sets 80R, 80S and 80T for each motor system, that is, R-phase, S-phase and T-phase of the three-phase induction motor M. The main circuits 1H and 1L are connected in series in the similar manner as the power conversion apparatus 100 shown in FIG. 1. Each set 80R, 80S and 80T is connected in parallel to the DC power source E so that its output is provided from each junction Pr, Ps and Pt between the main circuit 1H and the main circuit 1L. The three-phase induction motor M is formed of inductive loads LD1, LD2 and LD3, which are connected in a star shape. Terminals T1, T2 and T3 of these loads are connected to the junctions Pr, Ps and Pt, respectively.

The half-bridge circuit forming the power conversion apparatus 100 shown in FIG. 1A corresponds, for example, to a circuit, which passes the circuit for the R-phase, the junction Pr, the load LD1, the load LD2, the terminal T2 of the three-phase induction motor M, the junction Ps of the S-phase and the switching element SW2 of the on-state of the main circuit 1L. In the power conversion circuit 80, the main circuits 1H and the main circuit 1L are provided symmetrically to the loads LD1, LD2 and LD3 in each phase. The load current, which flows in the opposite direction described with reference to the power conversion apparatuses 100 to 106, flows to the loads LD1, LD2 and LD3.

Figure 13A:
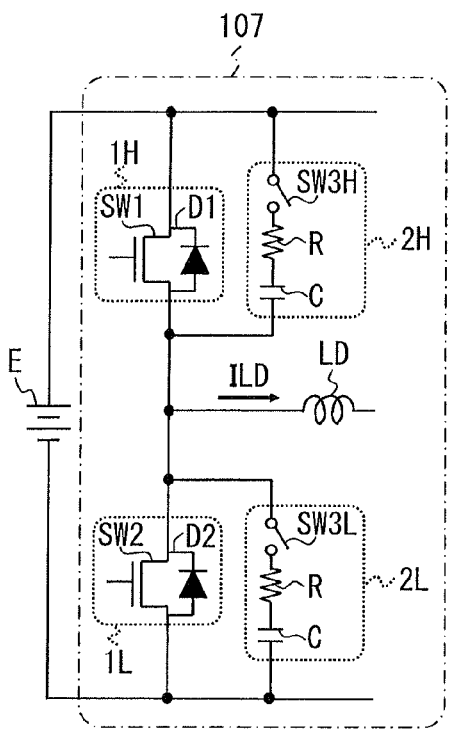
FIGS. 13A and 13B are a circuit diagram showing one phase of the inverter shown in FIG. 12, and a flowchart showing control of one phase of the inverter shown in FIG. 13A, respectively.

The inverter for converting the DC power to the AC power has, as exemplified as a power conversion apparatus 107 shown in FIG. 13A, auxiliary circuits 2H and 2L are connected in parallel to the main circuit 1H and the main circuit 1L, respectively. The auxiliary circuit 2H includes a high-side switching element SW3H and a capacitor C. The auxiliary circuit 2L includes a low-side switching element SW3L and a capacitor C. The power conversion apparatus 107 is used as each circuit for the R-phase, S-phase and T-phase of the power conversion apparatus 80 shown in FIG. 12.

Figure 13B:
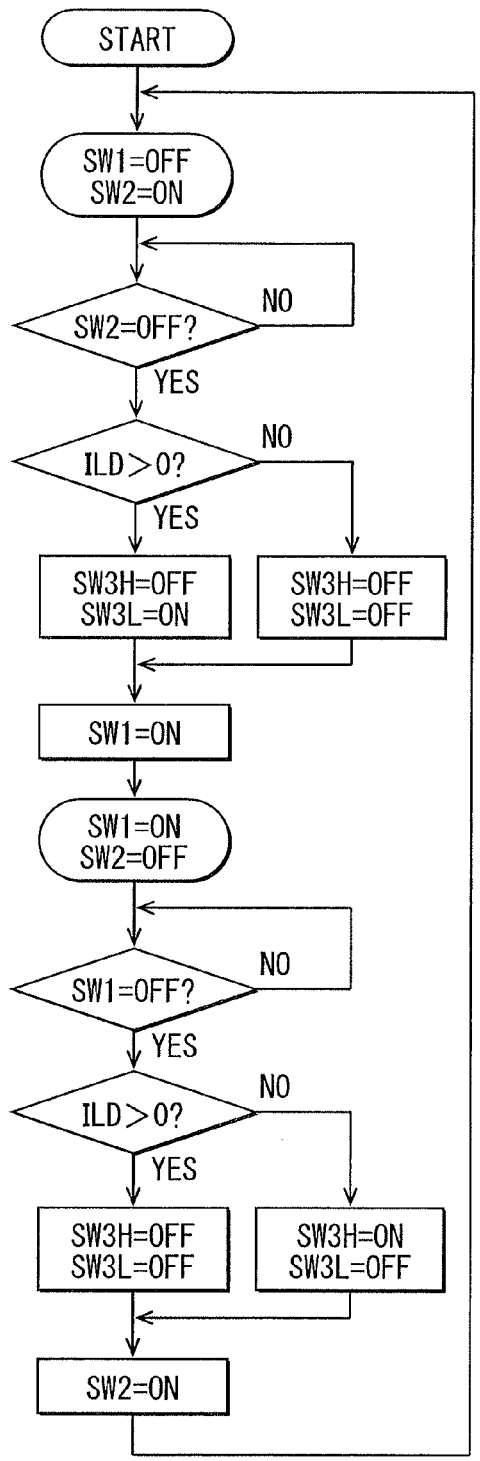

As shown in the flowchart of FIG. 13B, the power conversion apparatus 107 having two main circuits 1H and 1L and two auxiliary circuits 2H and 2L is controlled by turning on and off the switching elements SW1 and SW2 complementarily. Each of the auxiliary circuits 2H and 2L performs the sequence of operation of the auxiliary circuit 2L in each cycle of the power conversion apparatus 100 relative to the load current ILD, which reverses the flow direction when the switching elements SW1 and SW2 are in the on-states, respectively. That is, when the switching element SW2 is turned off (SW2=OFF) with the switching element SW1 being in the off-state (SW1=OFF) and the load current is positive (ILD>0), only the switching element SW3L is turned on (SW3L=ON) and then the switching element SW1 is turned on (SW1=ON). Similarly, when the switching element SW1 is turned off (SW1=OFF) with the switching element SW2 being in the on-state (SW2=OFF) and the load current is positive (ILD>0), only the switching element SW3H is turned on (SW3H=ON) and then the switching element SW2 is turned on (SW2=ON).

All of the power conversion apparatuses described above are for the DC power source using the switching elements such as the power MOSFETs.

These power conversion apparatuses can suppress the current surge and the voltage surge, which are generated by the reverse recovery current, and lower the loss during the dead time period more than the conventional apparatus does.

The power conversion apparatuses are suitable for a vehicle having a large number of electronic devices, for which the current surge, the voltage surge and the continuing resonance should be suppressed surely for protection from erroneous operation, and are suitable for a battery of a vehicle, which is a DC power source that has a limited power capacity and requires less loss.

What is claimed is:

1. A power conversion apparatus for supplying electric power of a DC power source to an inductive load after conversion, the power conversion apparatus comprising:
  a set of main circuits connected in series and connected to the DC power source at a high side and a low side of the DC power source to supply the electric power from a junction between the main circuits, each of main circuits including a main switching element and a diode connected in parallel between both ends of the main switching element;
  an auxiliary circuit including an auxiliary switching element and a capacitor connected in series with the auxiliary switching element, the auxiliary circuit being connected in parallel to one of the main circuits including the diode as a freewheeling diode; and
  a control circuit for turning on the main switching elements in the main circuits alternately with a dead time period at a time of switching so that both of the main switching elements are turned off during the dead time period, the control circuit further turning on the auxiliary switching element in the dead time period to discharge the capacitor,
  wherein the control circuit turns on the auxiliary switching element in advance of a reference time by an interval of a discharging time period of the capacitor in the dead time period, the reference time being a time point at which the main switching element of another one of the main circuits is turned on under a condition that the main switching element of the one of the main circuit is in an off-state.

2. The power conversion apparatus according to claim 1, wherein:
the capacitor is set to have charges, which are more than reverse recovery charges stored in the freewheeling diode, at a time point the auxiliary switching element is turned on.

3. The power conversion apparatus according to claim 2, wherein:
the capacitor is discharged to store reverse charges, which deplete the freewheeling diode, at the reference time.

4. The power conversion apparatus according to claim 1, wherein:
the capacitor includes a plurality of capacitors connected in parallel to each other; and
the control circuit measures a current flowing to the load and selects a combination of the plurality of capacitors, which are used in the discharging time period, in correspondence to a measured current before the auxiliary switching element is turned on.

5. The power conversion apparatus according to claim 1, wherein:
the control circuit turns off the auxiliary switching element before the main switching element, which has turned on at the reference time, is in the on-state.

6. The power conversion apparatus according to claim 1, wherein:
the discharging time period is set to be shorter than one-half of the dead time period.

7. The power conversion apparatus according to claim 1, wherein:
the auxiliary circuit includes a resistor, which is connected in series with the auxiliary switching element and the capacitor.

8. The power conversion apparatus according to claim 7, wherein:
the capacitor, the resistor connected in series with the capacitor and a parasitic inductance on a substrate are set such that a series resonance value Q satisfies an over-attenuation condition $Q<\frac{1}{2}$, or a critical attenuation condition $Q=\frac{1}{2}$.

9. The power conversion apparatus according to claim 7, wherein:
the resistor includes a plurality of resistors connected in parallel or in series; and
the control circuit measures a current flowing to the load and selects a combination of the plurality of resistors, which are used in the discharging time period, before the auxiliary switching element is turned on during the dead time period in correspondence to a measured current.

10. The power conversion apparatus according to claim 1, wherein:
the control circuit measures a current flowing to the load and turns on the auxiliary switching element during the dead time period at a time point in correspondence to a measured current.

11. The power conversion apparatus according to claim 1, wherein:
the control circuit measures a current flowing in the freewheeling diode and turns on the main switching element in the another one of the main circuits in the dead time period at a time point corresponding to a measured current.

12. The power conversion apparatus according to claim 1, further comprising:
a delay circuit for controlling the main switching element or the auxiliary switching element to turn on.

13. The power conversion apparatus according to claim 1, wherein:
the main switching element is an insulated gate transistor; and
the diode is a parasitic diode, which is parasitic to the insulated gate transistor.

14. The power conversion apparatus according to claim 13, wherein:
the insulated gate transistor is a super-junction MOSFET.

15. The power conversion apparatus according to claim 13, wherein:
the auxiliary switching element is an insulated gate transistor, which has a same level of withstanding voltage as the main switching element.

16. The power conversion apparatus according to claim 1, wherein:
the main circuits form a part of an inverter, which converts the electric power of the DC power source to AC power supplied to the inductive load; and
the auxiliary circuit is connected to each of the main circuits in parallel.

17. The power conversion apparatus according to claim 16, wherein:
the inductive load is a three-phase induction motor; and
the set of main circuits is provided in each of three phases of the motor.

18. The power conversion apparatus according to claim 1, wherein:
the inductive load is mounted in a vehicle; and
the DC power source is a battery of the vehicle.

* * * * *